United States Patent
Buis et al.

(10) Patent No.: US 7,057,313 B2
(45) Date of Patent: ***Jun. 6, 2006

(54) COOLING OF VOICE COIL MOTORS

(75) Inventors: Edwin J. Buis, Belfeld (NL); Noud J. Gilissen, Eindhoven (NL); Yim Bun P. Kwan, Munich (DE); Paulus H. C. M. Schapendonk, Heeze (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 10/958,402

(22) Filed: Oct. 6, 2004

(65) Prior Publication Data

US 2005/0056792 A1    Mar. 17, 2005

Related U.S. Application Data

(63) Continuation of application No. 10/684,716, filed on Oct. 15, 2003, now abandoned, which is a continuation of application No. 09/777,701, filed on Feb. 7, 2001, now Pat. No. 6,657,204.

(30) Foreign Application Priority Data

Feb. 10, 2000  (EP) .................................. 00200432
May 23, 2000  (EP) .................................. 00304336

(51) Int. Cl.
    *H02K 41/00*    (2006.01)
(52) U.S. Cl. .......................................... 310/12
(58) Field of Classification Search ............. 310/12–14
    See application file for complete search history.

(56) References Cited

U.S. PATENT DOCUMENTS

| 3,553,502 A |   | 1/1971 | Kasahara et al. ............. 310/11 |
| 3,917,914 A | * | 11/1975 | Parker ......................... 381/416 |
| 4,698,818 A |   | 10/1987 | Heynisch ...................... 372/34 |

(Continued)

FOREIGN PATENT DOCUMENTS

JP         3-173333        7/1991

(Continued)

OTHER PUBLICATIONS

Morrison Jr., Phillip W., "The Cascade Arc," "http://www.cwru.edu/cse/eche/people/faculty/morrison/research/cascade.htm".

(Continued)

*Primary Examiner*—Darren Schuberg
*Assistant Examiner*—Judson H. Jones
(74) *Attorney, Agent, or Firm*—Pillsbury Winthrop Shaw Pittman, LLP

(57) ABSTRACT

A voice coil motor used, for example, in a positioning device associated with either a first object table or a second object table in which the coil is cooled with a cooling jacket in thermal contact with the coil, the cooling jacket comprising at least one channel for circulation of a cooling fluid, the or each channel being arranged such as to be substantially located in a portion of the cooling jacket adjacent to the coil, for use, for example, in a lithographic projection apparatus including a radiation system for supplying a projection beam of radiation, a first object table for holding a mask, a second object table for holding a substrate, a projection system for imaging irradiated portions of the mask onto target portions of the substrate. The cooling jacket may be formed of a ceramic material and may be of a monolithic construction.

18 Claims, 5 Drawing Sheets

U.S. PATENT DOCUMENTS

| | | | |
|---|---|---|---|
| 4,788,686 A | 11/1988 | Mentel | 372/37 |
| 4,839,545 A | 6/1989 | Chitayat | 310/12 |
| 4,871,580 A | 10/1989 | Schram et al. | 427/562 |
| 5,203,401 A | 4/1993 | Hamburgen et al. | 165/80.4 |
| 5,229,872 A | 7/1993 | Mumola | 349/2 |
| 5,296,891 A | 3/1994 | Vogt et al. | 355/67 |
| 5,523,193 A | 6/1996 | Nelson | 430/311 |
| 5,578,831 A | 11/1996 | Hershcovitch | 250/398 |
| 5,806,193 A | 9/1998 | Ebihara | 33/1 M |
| 5,846,883 A | 12/1998 | Moslehi | 438/711 |
| 5,850,280 A | 12/1998 | Ohtomo et al. | 355/53 |
| 5,907,453 A * | 5/1999 | Wood et al. | 360/97.02 |
| 5,969,441 A | 10/1999 | Loopstra et al. | 310/12 |
| 5,998,889 A | 12/1999 | Novak | 310/12 |
| 6,046,792 A | 4/2000 | Van Der Werf et al. | 355/53 |
| 6,209,480 B1 | 4/2001 | Moslehi | 118/723 I |
| 6,213,049 B1 | 4/2001 | Yang | 118/723 R |
| 6,226,073 B1 | 5/2001 | Emoto | 355/53 |
| 6,395,455 B1 * | 5/2002 | Gianoulakis et al. | 430/311 |
| 6,430,300 B1 * | 8/2002 | Cox et al. | 381/397 |
| 6,437,463 B1 | 8/2002 | Hazelton et al. | 310/12 |
| 6,442,975 B1 | 9/2002 | Murakami et al. | 65/61 |
| 6,449,030 B1 | 9/2002 | Kwan | 399/72 |
| 6,525,803 B1 | 2/2003 | Kwan et al. | 355/53 |
| 6,657,204 B1 * | 12/2003 | Buis et al. | 250/398 |
| 6,865,281 B1 * | 3/2005 | Jordan | 381/397 |
| 2002/0006762 A1 | 1/2002 | Hutcherson et al. | 445/26 |
| 2002/0047760 A1 | 4/2002 | Kunikiyo | 333/214 |
| 2002/0153130 A1 | 10/2002 | Okamoto et al. | 165/170 |
| 2003/0049468 A1 | 3/2003 | Hu et al. | 428/451 |
| 2004/0079898 A1 | 4/2004 | Buis et al. | 250/492.2 |

FOREIGN PATENT DOCUMENTS

| | | |
|---|---|---|
| JP | 10-127035 | 5/1998 |
| JP | 11-307430 | 11/1999 |
| JP | 2001-284247 | 12/2001 |
| WO | WO 98/40791 | 9/1998 |

OTHER PUBLICATIONS

Patent Abstracts of Japan JP 09 154272, vol. 1997, No. 10, Jun. 10, 1997.

Korean Office Action issued in Korean Application No. 10-0005929 dated Nov. 9, 2005.

\* cited by examiner

COOLING OF VOICE COIL MOTORS

This is a continuation of U.S. application Ser. No. 10/684,716 filed Oct. 15, 2003, now abandoned, which is a continuation of U.S. application Ser. No. 09/777,701, filed Feb. 7, 2001, now U.S. Pat. No. 6,657,204, which claims priority from European Patent Application Nos. 00200432.3, filed Feb. 10, 2000 and 00304336.1, filed May 23, 2000, the entire contents of which are hereby incorporated by reference.

BACKGROUND OF THE INVENTION

1. Field of the Invention

The present invention relates generally to arrangements for cooling voice coil motors.

2. Discussion of Related Art

The terms "patterning means," "mask," or "projection beam patterning structure" should be broadly interpreted as referring to means that can be used to endow an incoming radiation beam with a patterned cross-section, corresponding to a pattern that is to be created in a target portion of the substrate; the term "light valve" has; also been used in this context. Generally, the said pattern will correspond to a particular functional layer in a device being created in the target portion, such as an integrated circuit or other device (see below). Examples of such patterning means include:

A mask table for holding a mask. The concept of a mask is well known in lithography, and its includes mask types such as binary, alternating phase-shift, and attenuated phase-shift; as well as various hybrid mask types. Placement of such a mask in the radiation beam causes selective transmission (in the case of a transmissive mask) or reflection (in the case of a reflective mask) of the radiation impinging on the mask, according to the pattern on the mask. The mask table ensures that the mask can be held at a desired position in the incoming radiation beam, and that it can be moved relative to the beam if so desired.

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing; pattern of the matrix-adressable surface. The required matrix addressing care be performed using suitable electronic means. More information on such mirror arrays can be gleaned, for example, from U.S. Pat. Nos. 5,296,891 and 5,523,193, which are incorporated herein by reference.

A programmable LCD array. An example of such a construction is given in U.S. Pat. No. 5,229,872, which is incorporated herein by reference.

For purposes of simplicity, the rest of this text may, at certain locations, specifically direct itself to examples involving a mask table and mask; however, the general principles discussed in such instances should be seen in the broader context of the patterning means as hereabove set forth.

SUMMARY OF THE INVENTION

For the sake of simplicity, the projection system may hereinafter be referred to as the "lens;" however, this term should be broadly interpreted as encompassing various types of projection system, including refractive optics, reflective optics, catadioptric systems, and charged particle optics, for example. The radiation system may also include elements operating according to any of these principles for directing, shaping or controlling the projection beam of radiation, and such elements may also be referred to below, collectively or singularly, as a "lens." In addition, the first and second object tables may be referred to as the "mask table" and the "substrate table," respectively. Further, the lithographic apparatus may be of a type having two or more mask tables and/or two or more substrate tables. In such "multiple table" devices the additional tables may be used in parallel, or preparatory steps may be carried out on one or more tables while one or more other tables are being used for exposures. Twin stage lithographic apparatus are described, for example, in U.S. Pat. No. 5,969,441 and U.S. Ser. No. 09/180,011, filed 27 Feb. 1998 (W098/40791), incorporated herein by reference.

Lithographic projection apparatus can be used, for example, in the manufacture of integrated circuits (ICs). In such a case, the mask (reticle) may contain a circuit pattern corresponding to an individual layer of the IC, and this pattern can be imaged onto a target portion (comprising one or more dies) on a substrate (silicon wafer) which has been coated with a layer of photosensitive material (resist). In general, a single substrate will contain a whole network of adjacent target portions which are successively irradiated via the mask, one at a time. In one type of lithographic projection apparatus, each target portion is irradiated by exposing the entire mask pattern onto the target portion at once; such an apparatus is commonly referred to as a wafer stepper. In an alternative apparatus—which is commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed at which the substrate table is scanned will be a factor M times that at which the mask table is scanned. More information with regard to lithographic devices as here described can be gleaned from U.S. Pat. No. 6,046,792, incorporated herein by reference.

In a lithographic apparatus, voice coil motors (typically Lorentz-force motors) are used, for example, for fine positioning of the substrate table and the mask table. The motors dissipate heat in operation which, if not removed in a controlled manner, would affect the thermal stability of the apparatus. In the case of the fine positioning of a substrate table, it is important that heat transfer from the motor to the substrate table is minimized. The substrate table is designed to be operated at a predetermined temperature and heat transfer to the substrate table may lead to expansion or contraction in the substrate table and/or the substrate causing an inaccuracy in the positioning of the substrate and thus of the target portion to be irradiated.

At present the coils of the motors are cooled by a thin metal cooling plate in thermal contact with the coil. Heat from the coil is removed by thermal conduction through the cooling plate to its sides which are connected to a water cooling system. Thus there is inevitably a temperature variation across the cooling plate, and heat loss by convection or radiation from the surfaces of the cooling plate can lead to a heat load on the substrate table which is too large. For example, in a typical design no more than 0.5 W out of approximately 350 W of heat dissipated in each voice coil motor can be allowed to escape to the surrounding components without causing a detrimental effect.

An embodiment of the present invention provides an improved manner of cooling the voice coil motors of lithographic apparatus which will result in a reduction in the heat loss to its surroundings.

According to embodiments of the present invention there is provided a lithographic projection apparatus including a radiation system for providing a projection beam of radiation, patterning device, for patterning the projection beam according to a desired pattern, a substrate table for holding a substrate, a projection system for imaging the patterned beam onto a target portion of the substrate, at least one of the patterning device and the substrate table is associated with positioning devices including at least one voice coil motor having a coil in thermal contact with a cooling jacket the cooling jacket includes at least one channel for circulation of a cooling fluid, the or each channel being arranged such as to be substantially located in a portion of the cooling jacket adjacent to the coil.

Certain embodiments of the present invention are advantageous in that heat is removed directly from the coil to the cooling medium through a large area of contact, thus reducing substantially the amount of heat escaping to the surrounding components and therefore reducing inaccuracies caused by thermal expansion of the object table and any object thereon.

In one embodiment, the cooling jacket is made from an electrically non-conducting material. This is advantageous as it will prevent undesirable eddy-current damping within the magnetic field of the stator. The use of a ceramic material, for example $Al_2O_3$ or AlN, is particularly desirable as the processing and properties of ceramic materials are already well known. Ceramic materials do not absorb water (which is a particular disadvantage of composite materials); they have high strength (and can therefore sustain a higher cooling fluid operating pressure for a given dimension) and they do not outgas (and are hence suitable for use in a vacuum).

In another embodiment of the invention at least one part of a ceramic cooling jacket having at least one channel located therein, is formed as a single monolithic component. This is advantageous as this will provide the strongest possible structure for the cooling jacket. A monolithic component is less subject to the risk of delamination than laminated designs.

In another embodiment of the invention at least one part of a ceramic cooling jacket, having at least one channel located therein is formed from two components which are bonded together to form said one part, at least one of the contacting surfaces of the components comprising at least one groove which forms the channel(s) in the bonded state. This is advantageous because it is then possible to provide a cooling jacket in which the thermal properties can be optimized for each position within the structure, rather than having uniform thermal properties across the cooling jacket which are a compromise.

In yet another example of an embodiment, at least one part of a ceramic cooling jacket, having at least one channel located therein is formed from three components that are bonded together, an intermediate component being formed with sections of material removed, said sections forming the channels in the bonded state. This also advantageously allows the thermal properties of the separate parts of the structure to be optimized.

According to a further aspect of the invention there is provided a device manufacturing method including providing a substrate that is at least partially covered by a layer of radiation-sensitive material, providing a projection beam of radiation using a radiation system, using a patterning device to endow the projection beam with a pattern in its cross-section, projecting the patterned beam of radiation onto a target portion of the layer of radiation-sensitive material, wherein at least one of said substrate table and said patterning means if positioned using at least one voice coil motor having a coil in thermal contact with a cooling jacket, such that the cooling fluid is substantially passed through a portion of the cooling jacket adjacent to the coil.

In a manufacturing process using a lithographic projection apparatus according to the invention a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallisation, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer" or "die" in this text should be considered as being replaced by the more general terms "mask," "substrate" and "target portion," respectively.

In the present document, the terms "radiation" and "beam" are used to encompass all types of electromagnetic radiation or particle flux, including, but not limited to, ultraviolet (UV) radiation (e.g., at a wavelength of 365 nm, 248 nm, 193 nm, 157 nm or 126 nm), extreme ultraviolet (EUV) radiation, X-rays, electrons and ions. Also, in the present document reference may be made to X, Y, and Z axes, or to up, down and other similar spatial references. It should be understood that these terms are used with reference to the plane of the substrate and not relative to a general frame of reference. In the frame of reference used, the substantially planar substrate lies in a "horizontal" plane, defined by the X and Y axes. The Z axis denotes the "vertical" position and is perpendicular to the plane defined by the X and Y axes.

BRIEF DESCRIPTION OF THE DRAWINGS

The present invention will be described below with reference to exemplary embodiments and the accompanying schematic drawings, in which.

In the drawings, like reference numerals indicate like parts.

DETAILED DESCRIPTION OF THE INVENTION

Figure 1:
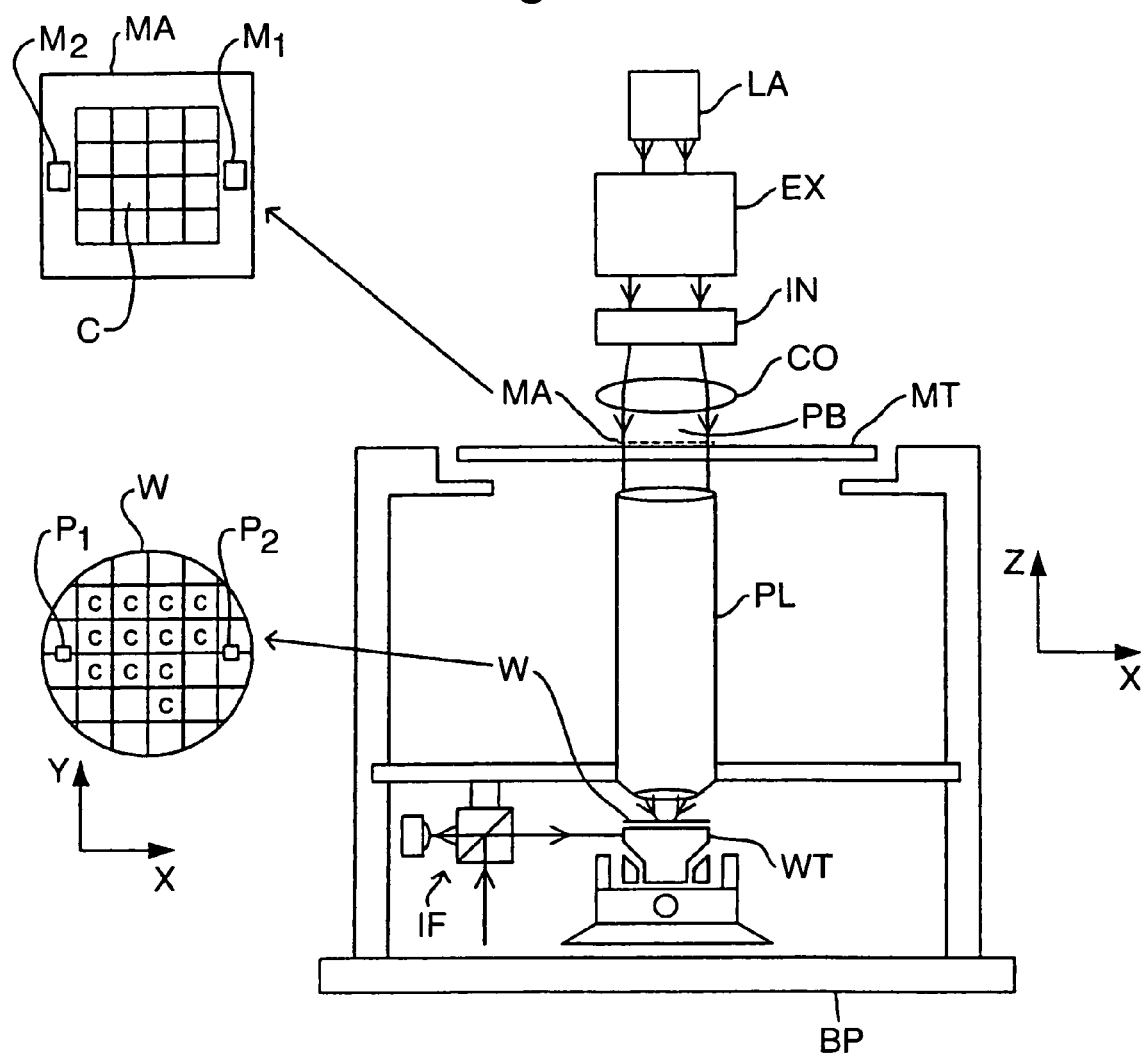
FIG. 1 depicts a lithographic projection apparatus according to a first embodiment of the invention.

FIG. 1 schematically depicts a lithographic projection apparatus according to the invention. The apparatus comprises:

a radiation system LA, Ex, IN, CO for supplying a projection beam PB of radiation (e.g., UV or EUV radiation);

a first object table (mask table) MT for holding a mask MA (e.g., a reticle), and connected to first positioning means for accurately positioning the mask with respect to item PL;

a second object table (substrate table) WT for holding a substrate W (e.g., a resist-coated silicon wafer), and connected to second positioning means for accurately positioning the substrate with respect to item PL;

a projection system ("lens") PL (e.g., a refractive or catadioptric system, a mirror group or an array of field deflectors) for imaging an irradiated portion of the mask MA onto a target portion C (comprising one or more dies) of the substrate W. As here depicted, the apparatus is of a transmissive type (i.e., has a transmissive mask). However, in general, it may also be of a reflective type, for example.

The radiation system may comprise a source LA (e.g., a Hg lamp, excimer laser, an undulator provided around the path of an electron beam in a storage ring or synchrotron, or an electron or ion beam source) which produces a beam of radiation. This beam is caused to traverse various optical components comprised in the illumination system, e.g., beam shaping optics Ex, an integrator IN and a condenser CO—so that the resultant beam PB has a desired uniformity and intensity distribution in its cross-section.

The beam PB subsequently intercepts the mask MA which is held on a mask table MT. Having passed through the mask MA, the beam PB traverses the lens PL, which focuses the bean PB onto a target portion C of the substrate W. With the aid of the interferometric displacement measuring means IF and the second positioning means, the substrate table WT can be moved accurately, e.g., so as to position different target portions C in the path of the beam PB. Similarly, the interferometric displacement measuring means IF and the first positioning means can be used to accurately position the mask MA with respect to the path of the beam PB, e.g., after mechanical retrieval of the mask MA from a mask library. In general, movement of the object tables MT, WT will be realized with the aid of a long stroke module (course positioning) and a short stroke module (fine positioning), which are not explicitly depicted in FIG. 1. The depicted apparatus can be used in two different modes:

In step mode, the mask table MT is kept essentially stationary, and an entire mask image is projected at once (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash." Instead, the mask table MT is movable in a given direction (the so-called "scan direction," e.g., the y direction) with a speed v, so that the projection beam PB is caused to scan over a mask image; concurrently, the substrate table WT is simultaneously moved in the same or opposite direction at a speed $V=Mv$, in which M is the magnification of the lens PL (typically, $M=\frac{1}{4}$ or $\frac{1}{5}$). In this manner, a relatively large target portion C can be exposed, without having to compromise on resolution.

Figure 2:
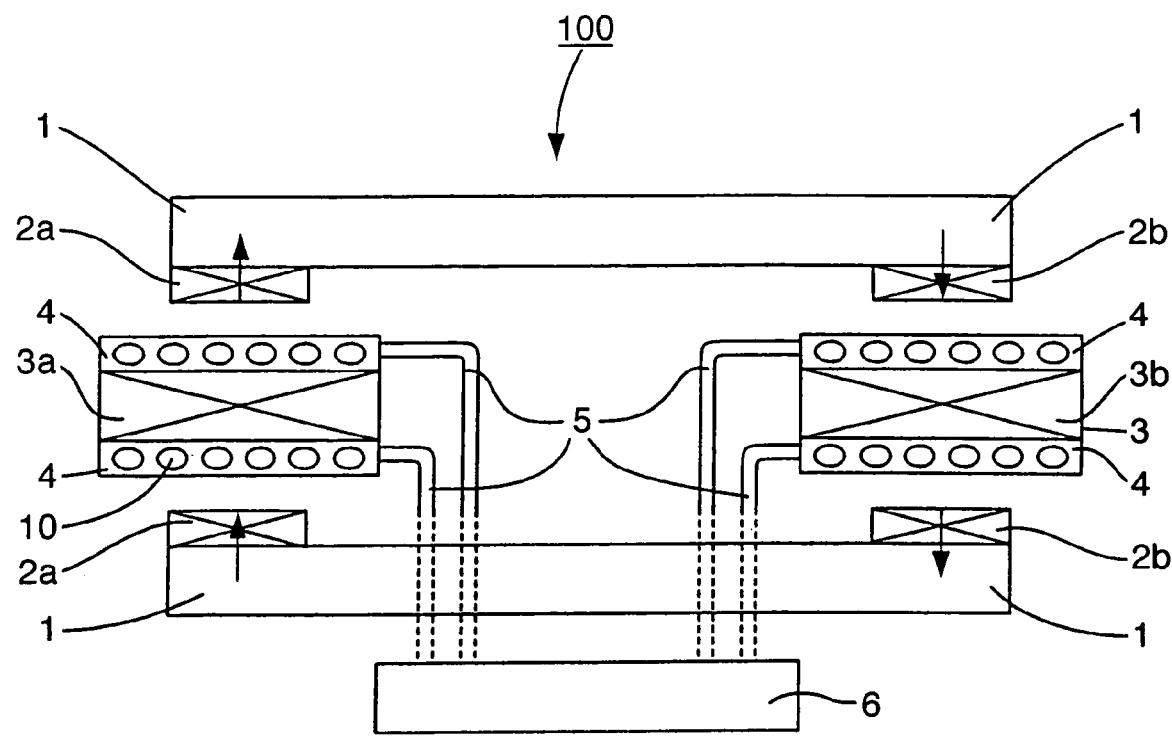
FIG. 2 is a schematic representation of a voice coil motor with a cooling system of the first embodiment of the present invention.

FIG. 2 shows in cross-section the layout of a voice coil, or Lorentz-force, motor 100. The voice coil motor is comprised of a coil 3, two sets of permanent magnets 2a, 2b mounted on a yoke 1, and cooling jacket 4. The yoke 1 is mounted on the substrate table or the mask table and the combination of the table, the yoke and the magnets is moveable with respect to the coil.

The permanent magnets are mounted on the yoke 1 with the north-south directions orientated as indicated by the arrows, the direction of the magnetic field created by the first set of permanent magnets 2a being orientated substantially opposite to the direction of the magnetic field created by the second set of permanent magnets 2b. The coil 3 contains a plurality of windings and the plane of the windings is perpendicular to the plane of the drawing and perpendicular to the direction of the magnetic fields. A first portion of the coil 3a passes through the magnetic field created by the first set of permanent magnets 2a, and a second portion of the coil 3b passes through the magnetic field created by the second set of permanent magnets 2b. The direction of an electric current in the windings at the first portion 3a and second portion 3b of the coil 3 will be opposite and perpendicular to the plane of the drawing. Thus when an electric current is flowing in the coil, a Lorentz force will be induced between each of the first set of permanent magnets 2a and the first portion of the coil 3a and the second set of permanent magnets 2b and the second portion of the coil 3b. In both cases the Lorentz force will be parallel to the plane of the drawing (but perpendicular to the direction of the magnetic fields created by the magnets) and both Lorentz forces will be in the same direction.

However, when the electric current is flowing through the coil 3, it creates heat which needs to be dissipated. In the present invention the cooling jacket 4 is attached directly onto the upper and lower surfaces of the coil. The cooling jacket may be attached to and cool the coil as shown in FIG. 2. Alternatively the cooling jacket may cover the entire coil including the center portion where there are no windings. In addition a single cooling jacket may be attached to and provide cooling for a plurality of coils.

The cooling jacket has connecting channels 5 which connect the cooling jacket to a water cooling system 6. The connecting channels may be comprised of flexible plastic tubes and/or rigid stainless steel tubing, however there may be a variety of other means for connecting the cooling jacket to the water cooling system and the invention is not intended to be limited to a particular means. As will be further described below, the cooling jacket 4 has channels 10, in which water from the cooling system can flow via the connecting channels 5. The heat created by the electric current flowing through the coil 3 passes into the cooling water in the channels 10 which flows back to the cooling system 6 where the heat is removed and the temperature of the cooling water is regulated to a pre-determined value.

It can be appreciated that a variety of fluids could be used as the cooling medium instead of the cooling water described above. Furthermore a variety of cooling systems which could be connected to the cooling jacket 4 are already well known and will not be further discussed in this document as the choice of cooling system 6 is not critical to the present invention.

Figure 7:
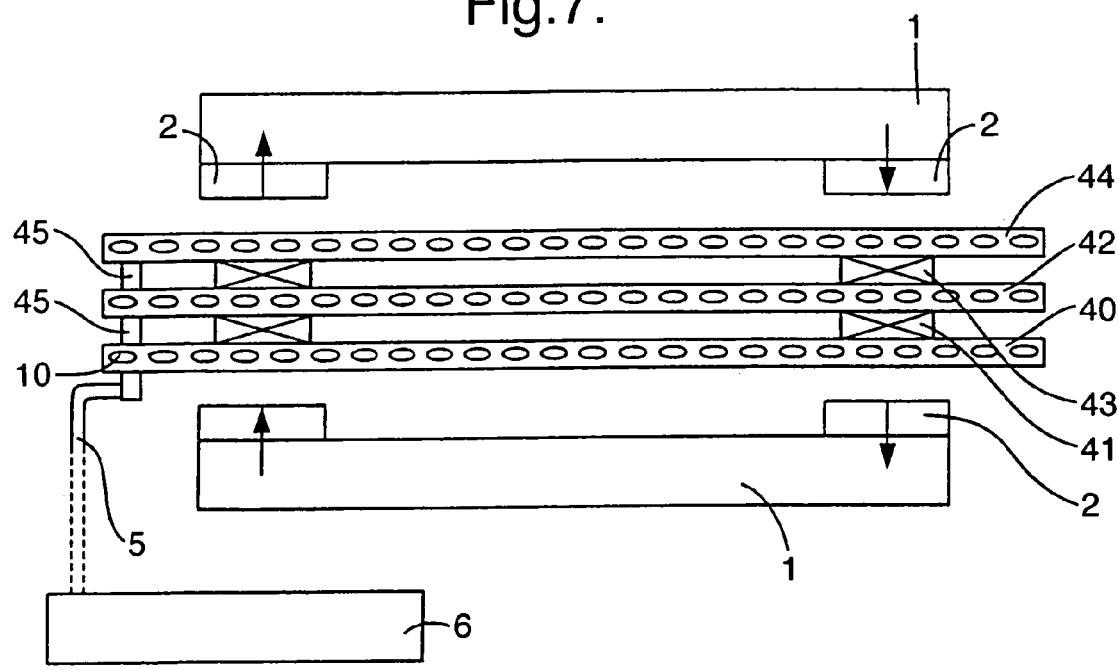
FIG. 7 is a schematic of a voice coil motor with a variation of the cooling system of FIG. 2.

As described above, in an embodiment the cooling jacket is attached to the top and bottom sides of the coil. However, the invention is not limited to this arrangement. A variation of this embodiment is shown in FIG. 7. In this arrangement the coil-cooling jacket assembly is comprised of alternating layers of coil and cooling jacket. In the example shown there are two coil layers 41, 43. The lower coil layer 41 has lower cooling jacket layer 40 attached to its bottom side and nuddle cooling jacket layer 42 attached to its upper side. Coil layer 43 has middle cooling jacket layer 42 attached to its bottom side and upper cooling jacket layer 44 attached to its upper side. Each of the cooling jacket layers 40, 42, 44 has channels 10 in which cooling fluid can low. The channels 10 in each cooling jacket layer are connected to one another by water connection manifolds 45 and are connected to the water cooling system 6 by connecting channels 5 as before. It will be appreciated that the layout and number of layers used can be varied within the scope of the invention.

In voice coil motor 100 the clearance between the permanent magnets and the coil is limited by practical motor design considerations. This in turn will limit the maximum thickness that the cooling jacket can encompass. In practice in a lithographic apparatus this clearance will be about 2 to 4 mm on each side of the coil, limiting the maximum thickness of each cooling jacket to about 1.5 mm.

Figure 3:
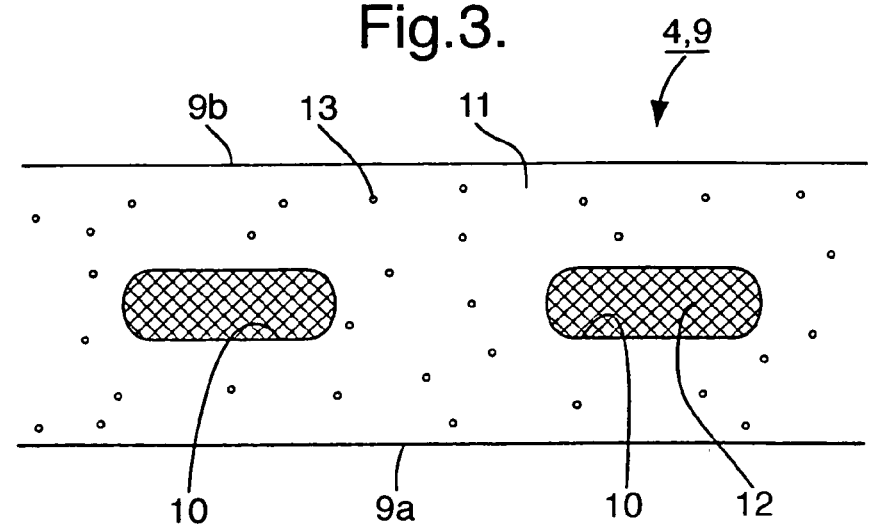
FIG. 3 is a cross-section of a cooling jacket according to the first embodiment of the invention.

FIG. 3 shows a cross-section of a portion of the cooling jacket 4 of the first embodiment of the invention. The cooling jacket is comprised of a substantially planar body 9 with channels 10 through it. The channels are substantially parallel to the plane of the cooling jacket (perpendicular to the plane of FIG. 3) and the cooling water flows through them. The lower surface 9a is attached to the surface of the coil with a thermally conductive but electrically insulating compound, and the upper surface is exposed to the environment. (It will be appreciated that when a portion of the cooling jacket is attached to the lower surface of the coil surface, 9a will become the upper surface of the cooling jacket and surface 9b will become the lower surface of the cooling jacket.) Thus the heat from the voice coil will be conducted through the lower surface 9a and into the cooling water in the channels 10. Ideally the heat flow passing through the cooling jacket to the upper surface 9b will be negligible. To facilitate this, an upper portion of the planar body 9 of the cooling jacket 4, which is adjacent to the upper surface 9b, may have a relatively low thermal conductivity and a lower portion of the planar body 9 of the cooling jacket 4, which is adjacent to the lower surface 9a, may have a relatively high thermal conductivity. Overall the thermal conductivity of the entire jacket may be lower than that of the prior art as the length of the desired heat-flow path to the cooling water is greatly reduced.

As is apparent from the foregoing description at least a part of the cooling jacket 4 will be located in the magnetic field of the voice coil motor 100. It will therefore be advantageous if the cooling jacket is made from an electrically non-conducting material so as to prevent undesirable eddy-current damping. Such a material could be a plastic, a composite material, or preferably a ceramic. As previously stated, ceramic materials are advantageous in the present situation because of their relatively good thermal conductivity, and their fabrication methods and mechanical properties are well known. In the preferred embodiment of the invention the cooling jacket 4 will therefore be made from a ceramic material such as $Al_2O_3$ or AlN, but the invention should not be considered as limited to any particular type of material.

The embodiment in FIG. 3 shows part of a cooling jacket 4 which has been fabricated as a single ceramic component 11. This is achieved by casting or cold-pressing the ceramic powder particles 13 onto a former 12, which resembles the shape of the channels 10. The former can subsequently be removed either by melting at a temperature which is lower than the sintering temperature of the ceramic which is being used or by chemically dissolving the former. The cooling jacket can then be completed by sintering. The resulting cooling jacket has a monolithic construction. As described above it may be desirable to use different ceramics for the top and bottom portions of the cooling jacket. It is possible to produce the cooling jacket of this embodiment using two different ceramics. However, it will be more difficult to realize because of differing sintering temperatures and amounts of shrinkage.

Embodiment 2

Figure 4:
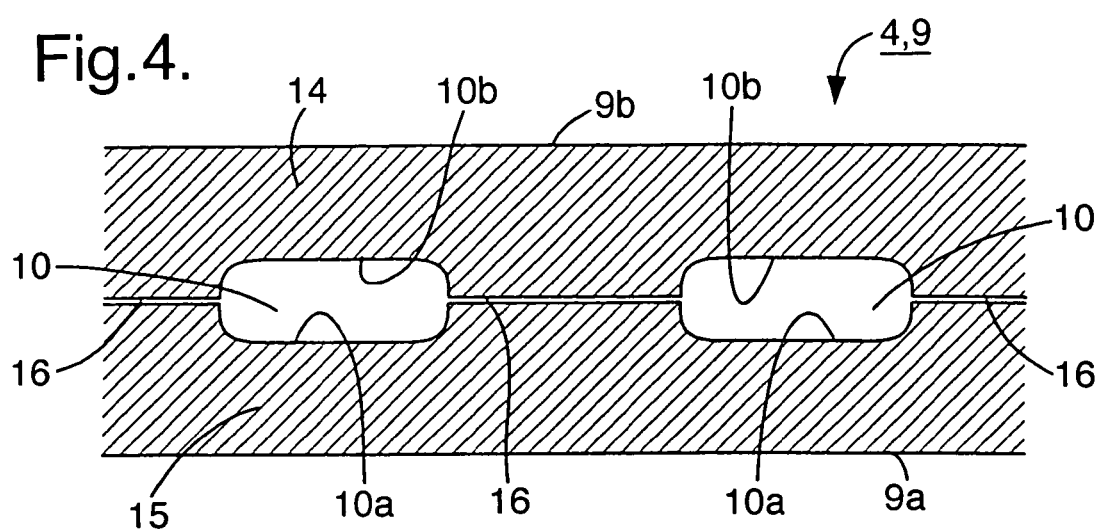
FIG. 4 is a cross-section of a cooling jacket according to a second embodiment of the invention.

A second embodiment of the cooling jacket 4 of the invention is shown in FIG. 4. In this case the cooling jacket is created by forming an upper portion, or component, 14 and a lower portion, or component, 15 of the cooling jacket. The upper portion 14 is comprised of a planar body with grooves 10b and the lower portion 15 is comprised of a planar body with grooves 10a, grooves 10a, 10b being formed in the contacting surfaces of portions 14, 15. Each of these portions are made by conventional ceramic processing methods and sintered. The two portions are subsequently bonded together along the bond lines 16 by a technique such as glass bonding. When the upper and lower portions are bonded together the grooves in each, 10a and 10b, are lined up such that the combination of the grooves 10b on the upper portion 14 and the grooves 10a on the lower portion 15 combine to form the channels 10. As described above it may be desirable to use different ceramic compositions which have different thermal conductivities for the upper and lower portions. Also, four grooves may be provided in any one of the upper portion 14 and lower portion 15, with the other having a flat surface.

Embodiment 3

Figure 5:
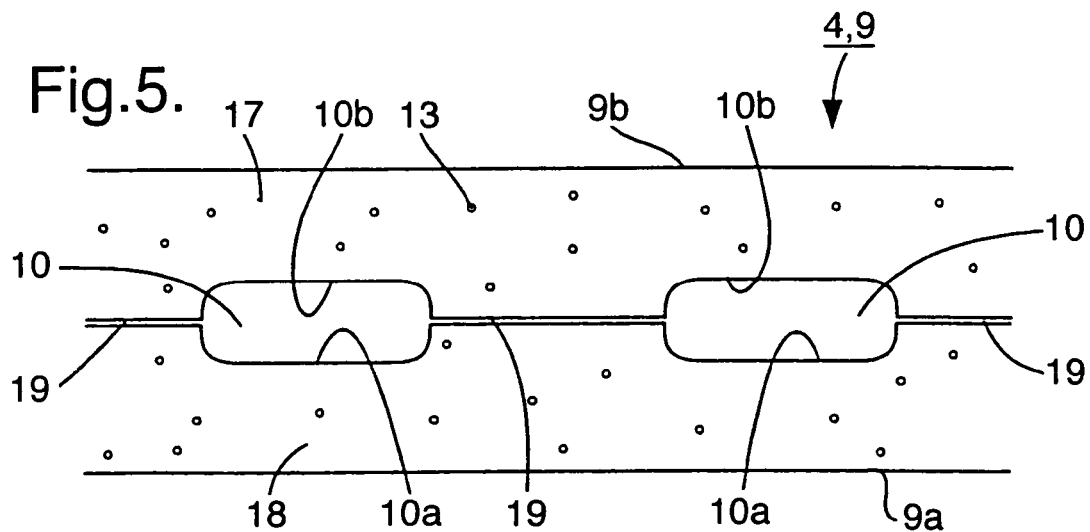
FIG. 5 is a cross-section of a cooling jacket according to a third embodiment of the invention.

FIG. 5 shows the cooling jacket 4 of a third embodiment of the invention. This is a variation of the second embodiment. In this case the upper portion 17 and the lower portion 18 are again formed by conventional ceramic processing methods but are not immediately sintered. Instead the two unsintered portions (in the green state) are pressed together such that grooves 10a and lob line up to form channels 10 and the two portions are joined at join line 19. The cooling jacket assembly is then co-fired to form a single monolithic component. Again different ceramic compositions can be used for the upper and lower portions.

Embodiment 4

Figure 6:
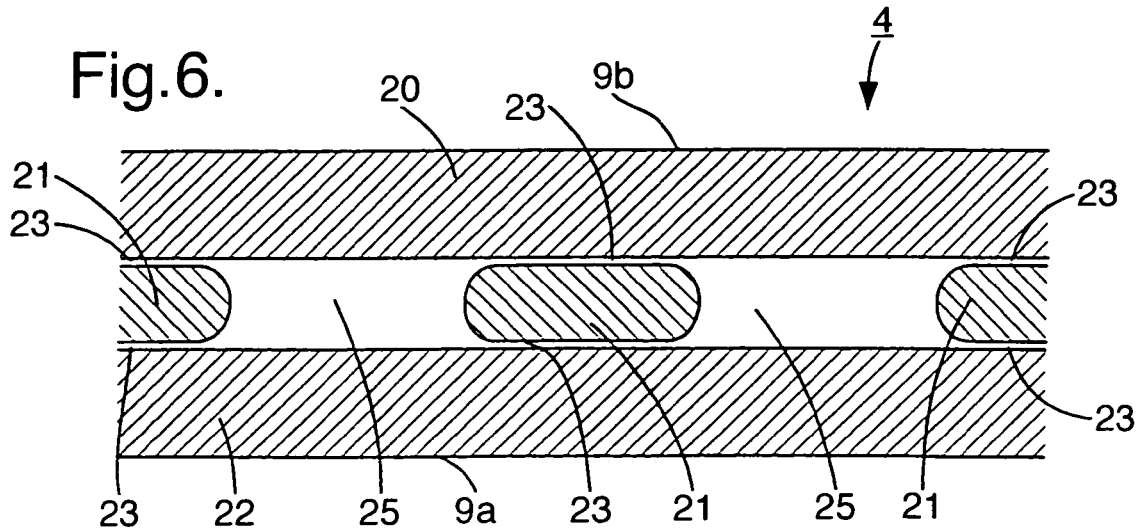
FIG. 6 is a cross-section of a cooling jacket according to a fourth embodiment of the invention.

A fourth embodiment of the cooling jacket 3 is shown in FIG. 6. In this case the cooling jacket is composed of three layers: a substantially planar upper layer, or component, 20, a substantially planar lower layer, or component, 22 and a middle layer, or component, 21. The upper layer and the lower layer do not have grooves and can be formed and sintered according to conventional ceramic processing techniques. The middle layer is formed as a series of strips 21 of material with gaps 25 in between. The middle layer may be formed either as a planar layer from which strips of material are removed, for example by laser machining, to leave just the required strips of material or can be formed directly, by conventional ceramic processes. The three layers are then bonded together at bond lines 23 by a method such as glass bonding. As in other embodiments each of the layers may be formed from different ceramic compositions.

It will be appreciated that the third and fourth embodiments of the invention may be combined. That is to say, a cooling jacket may be formed by pressing together the three layers of the fourth embodiment whilst they are still in the green state and then co-firing the assembly.

Figure 8A:
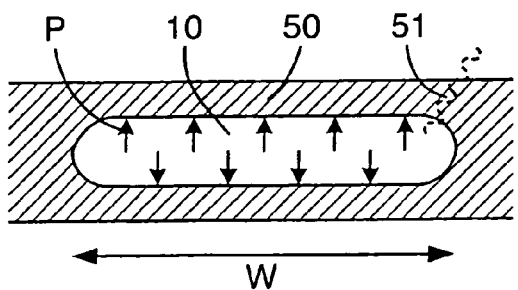
FIGS. 8a and 8b are cross-sections of channels through a cooling jacket of the invention.
Figure 8B:
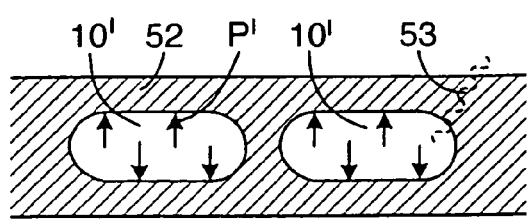

In the cooling jackets of the present invention the cooling jacket, and hence the channels 10 within, must generally be thin. This in turn results in high fluid flow resistance within the channels and therefore the cooling fluid circuit must be operated at high pressure P to maintain a sufficient flow rate. The fluid flow resistance and hence pressure P can be reduced by increasing the width W of the channels. However, as shown in FIG. 8a, increasing the effective length of the span 50 results in large bending stresses in the corner regions 51 of the cooling jacket. An alternative way to reduce the fluid flow resistance is to provide parallel channels as shown in FIG. 8b. The channel arrangements shown in FIGS. 8a and 8b have similar fluid flow resistances (and hence P and P' are similar) but the maximum bending stress in the corner 53 of the arrangement shown in FIG. 8b is much lower than the maximum bending stress in the corner 51 of the arrangement shown in FIG. 8a.

Figure 9A:
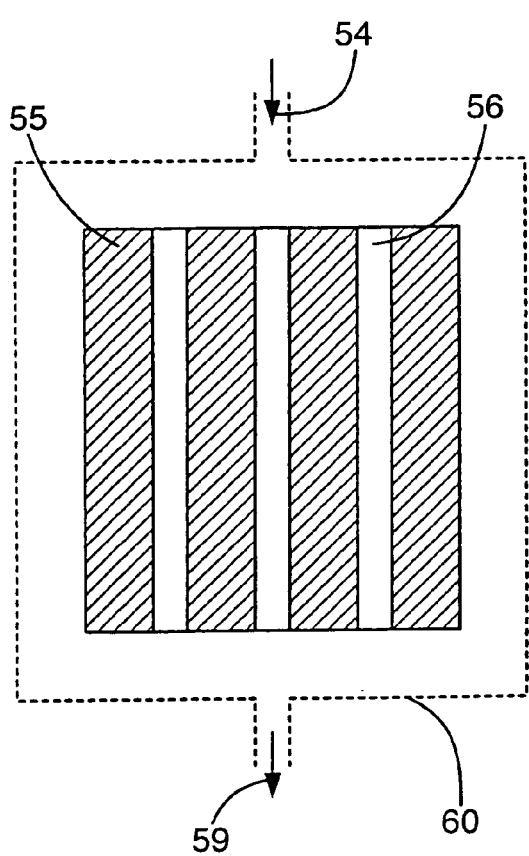
FIGS. 9a and 9b are plan views of channels in a cooling jacket of the invention.
Figure 9B:
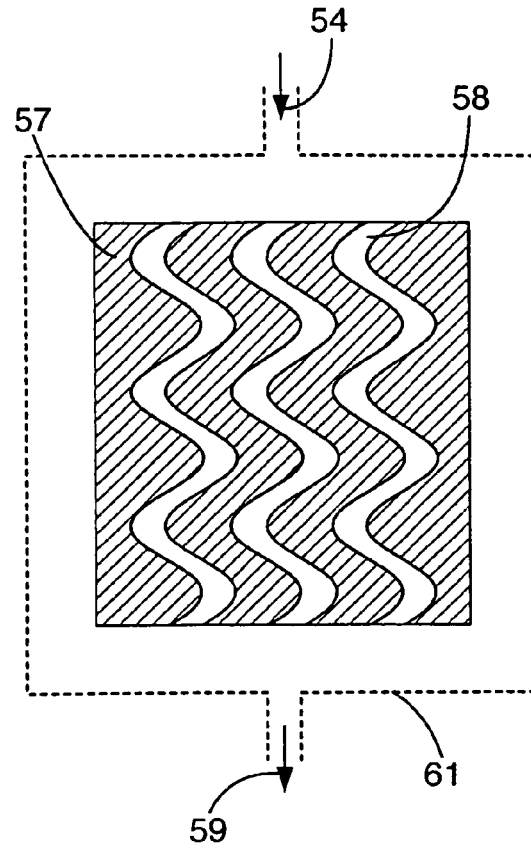

FIG. 9a and 9b schematically show the arrangement of parallel channels 56, 58 in sections 55, 57 of cooling jackets 60, 61 of the present invention. The channels have a common cooling fluid inlet 54 and a common fluid outlet 59. In all of the embodiments of the invention the cooling jackets may have straight channels 56 or serpentine channels 58, as shown in FIGS. 9a and 9b respectively, but the invention should not be considered as limited to only these configurations.

While we have described above specific embodiments of the invention it will be appreciated that the invention may be practiced otherwise than described. For example, the cooling jacket may, be formed of any convenient number of sub-layers (more than three) which may be of similar or different materials and may be grooved as desired. The description is not intended to limit the invention.

We claim:

1. A cooled voice coil motor apparatus comprising:
   a coil comprising a conducting material;
   a magnet, operatively cooperating with the coil when the coil is energized, such that a force is generated between the magnet and the coil;
   a cooling jacket, in thermal contact with the coil and comprising a channel for circulation of a cooling fluid, the channel being arranged such as to be substantially located in a portion of the cooling jacket adjacent to the coil.

2. Apparatus according to claim 1, wherein the cooling jacket comprises a plurality of channels which are configured such that the channels are evenly distributed in said portion of the cooling jacket adjacent to the coil.

3. Apparatus according to claim 2, wherein the channels are substantially straight.

4. Apparatus acording to claim 2, wherein the channels are serpentine.

5. Apparatus according to claim 1, wherein the cooling jacket comprises a substantially planar body.

6. Apparatus according to claim 1, wherein the coil comprises a plurality of wire turnings, all of which are in substantially the same plane, and the cooling jacket is substantially parallel to the plane of the turnings and attached to at least one of the upper and lower surfaces of the coil.

7. Apparatus according to claim 1, wherein the channel is substantially parallel to the plane of the portion of the cooling jacket within which it is located.

8. Apparatus according to claim 1, wherein the voice coil motor comprises alternating sections of coil and cooling jacket.

9. Apparatus according to claim 1, wherein the cooling fluid is water.

10. Apparatus according to claim 1, wherein the cooling jacket is made from an electrically non-conducting material.

11. Apparatus according to claim 10, wherein the cooling jacket is made from a ceramic.

12. Apparatus according to claim 11, wherein the ceramic is selected from the group comprising $Al_2O_3$ and AlN.

13. Apparatus according to claim 11, wherein at least one part of the cooling jacket having at least a portion of the channel located therein is formed as a single monolithic component.

14. Apparatus according to claim 11, wherein at least one part of the cooling jacket, having at least a portion of the channel located therein is formed from two components which are bonded together to form said one part, at least one of the contacting surfaces of the component comprising at least one groove which forms the channel in the bonded state.

15. Apparatus according to claim 11, wherein at least one part of the cooling jacket, having at least a portion of the channel located therein, is formed from three components that are bonded together, an intermediate component of said three components being formed with sections of material removed, said sections forming the channels in the bonded state.

16. Apparatus according to claim 15, wherein the components are joined by glass bonding.

17. Apparatus according to claim 15, wherein each of the components is formed from an unsintered material before bonding together, the components being bonded by pressing them together followed by sintering, so as to form a single monolithic component in a finished state.

18. A lithographic projection apparatus comprising:
   a radiation table which provides a projection beam of radiation;
   projection beam patterning structure which patterns the projection beam according to a desired pattern;
   a substrate table for holding a substrate;
   a projection system which images the patterned beam onto a target portion of the substrate;

at least one voice coil motor operatively associated with at least one of the projection beam patterning structure and the substrate table to position the same, said at least one voice coil motor having a coil in thermal contact with a cooling jacket;

a plurality of channels being arranged such as to be substantially located in a portion of the cooling jacket adjacent to the coil; and a cooling system connected to the cooling jacket for flowing a fluid at a predetermined temperature between the cooling jacket and the channels of the cooling system;

wherein the cooling jacket has a monolithic construction;

wherein the cooling jacket has a substantially planar body with a thermally conductive surface and a thermally non-conductive surface located opposite the thermally conductive surface;

wherein the thermally conductive portion of the cooling jacket is attached to a top and a bottom of the coil; and wherein the cooling jacket is made from an electrically non-conductive material.

\* \* \* \* \*